United States Patent
Ge et al.

(10) Patent No.: US 9,936,586 B2
(45) Date of Patent: Apr. 3, 2018

(54) ATTACHING APPARATUS FOR CHIP-ON-FILMS

(71) Applicants: BOE TECHNOLOGY GROUP CO., LTD., Beijing (CN); BEIJING BOE DISPLAY TECHNOLOGY CO., LTD., Beijing (CN)

(72) Inventors: Jie Ge, Beijing (CN); Peng Wang, Beijing (CN); Xueling Gao, Beijing (CN); Yubo Wang, Beijing (CN); Boning Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 228 days.

(21) Appl. No.: 14/910,801

(22) PCT Filed: Jul. 30, 2015

(86) PCT No.: PCT/CN2015/085539
§ 371 (c)(1),
(2) Date: Feb. 8, 2016

(87) PCT Pub. No.: WO2016/150058
PCT Pub. Date: Sep. 29, 2016

(65) Prior Publication Data
US 2017/0042041 A1 Feb. 9, 2017

(30) Foreign Application Priority Data

Mar. 23, 2015 (CN) .......................... 2015 1 0127868

(51) Int. Cl.
*B23P 19/00* (2006.01)
*H05K 3/30* (2006.01)
(Continued)

(52) U.S. Cl.
CPC ............... *H05K 3/30* (2013.01); *B65H 20/18* (2013.01); *B65H 23/26* (2013.01); *B65H 35/06* (2013.01);
(Continued)

(58) Field of Classification Search
CPC ........ B65H 35/06; B65H 37/04; B65H 20/18; B65H 23/26; G02F 1/1333; H01L 24/07; H05K 3/30
See application file for complete search history.

(56) References Cited

U.S. PATENT DOCUMENTS 5,188,699 A 2/1993 Senda
9,384,687 B2 * 7/2016 Lee ........................... G09G 3/20
(Continued)

FOREIGN PATENT DOCUMENTS

CN  201201354 Y  3/2009
CN  202367311 U  8/2012
(Continued)

OTHER PUBLICATIONS

Written Opinion of the International Searching Authority for International Application No. PCT/CN2015/085539 and International Search Report dated Dec. 29, 2015. Translation provided by Dragon Intellectual Property Law Firm.

*Primary Examiner* — Paul D Kim
(74) *Attorney, Agent, or Firm* — Harness, Dickey & Pierce, P.L.C.

(57) ABSTRACT

An attaching apparatus for chip-on-films includes: a base; a rotary table; a first driving device configured to drive the rotary table to rotate around the axis of the rotary table; a TCP side adhesive-attaching mechanism configured to attach a conductive film onto a chip-on-film on a carrier located in the TCP adhesive-attaching region; a PCB side adhesive-attaching mechanism configured to attach a con-
(Continued)

ductive film onto a chip-on-film on a carrier located in the PCB adhesive-attaching region; and a pre-pressing mechanism configured to pre-press conductive films attached on a chip-on-film on a carrier located in the pre-pressing region. The rotary table is in a first operating position, a second operating position, a third operating position and a fourth operating position successively during a rotation around its axis. When the rotary table is in any one of the operating positions, there is always one carrier in each region of the base.

20 Claims, 2 Drawing Sheets

(51) Int. Cl.
B65H 35/06 (2006.01)
B65H 37/04 (2006.01)
B65H 20/18 (2006.01)
B65H 23/26 (2006.01)
G02F 1/1333 (2006.01)
H01L 23/00 (2006.01)

(52) U.S. Cl.
CPC ........... *B65H 37/04* (2013.01); *G02F 1/1333* (2013.01); *H01L 24/75* (2013.01); *H05K 2201/10681* (2013.01); *H05K 2203/0195* (2013.01)

(56) References Cited

U.S. PATENT DOCUMENTS

| 2016/0351120 A1* | 12/2016 | Itakura | G09G 3/3233 |
| 2017/0018220 A1* | 1/2017 | Takahara | G09G 3/3233 |
| 2017/0263185 A1* | 9/2017 | Nakagawa | G09G 3/3258 |

FOREIGN PATENT DOCUMENTS

| CN | 102674070 A | 9/2012 |
| CN | 202721233 U | 2/2013 |
| CN | 103289593 A | 9/2013 |
| CN | 203210120 U | 9/2013 |
| CN | 103950266 A | 7/2014 |
| CN | 104773594 A | 7/2015 |
| CN | 204490180 U | 7/2015 |
| JP | 2005126203 A | 5/2005 |
| JP | 2009283742 A | 12/2009 |
| JP | 2013118319 A | 6/2013 |

* cited by examiner

ATTACHING APPARATUS FOR CHIP-ON-FILMS

CROSS-REFERENCE TO RELATED APPLICATION

This application is the U.S. national phase of PCT Application No. PCT/CN2015/085539 filed on Jul. 30, 2015, which claims a priority of the Chinese Patent Application No. 201510127868.2 filed on Mar. 23, 2015, the disclosures of which are incorporated in their entirety by reference herein.

TECHNICAL FIELD

The present disclosure relates to the field of displaying technology, in particular, to an attaching apparatus for chip-on-films.

BACKGROUND

In a display screen reuse project in the field of displaying technologies, a chip-on-film (COF) in a display screen needs to be replaced.

Processes of replacing the COF mainly include four steps of: attaching an anisotropic conductive film (ACF) onto a side of the COF where the COF connects to a transmission control protocol module (TCP), attaching an ACF onto a side of the COF where the COF connects to a printed circuit board (PCB), pre-pressing the conductive film at the TCP side and pre-pressing the conductive film at the PCB side.

An existing attaching apparatus for chip-on-films can merely perform serial operations for an individual COF. The waiting time in continuous operations is relatively long and thus the attaching efficiency of the COF is relatively low.

SUMMARY

The present disclosure provides an attaching apparatus for chip-on-films, which can enhance the attaching efficiency for chip-on-films.

To achieve the above objective, the present disclosure provides the following technical solutions.

In one aspect, the present disclosure provides in an embodiment an attaching apparatus for chip-on-films includes:

a base, which is provided with a mounting-dismounting region, a TCP adhesive-attaching region, a PCB adhesive-attaching region and a pre-pressing region;

a rotary table, which is mounted on the base and rotatable around an axis of the rotary table; wherein a first carrier, a second carrier, a third carrier and a fourth carrier are arranged on the rotary table;

when the rotary table is in a first operating position, the first carrier is located in the mounting-dismounting region, the second carrier is located in the TCP adhesive-attaching region, the third carrier is located in the PCB adhesive-attaching region, and the fourth carrier is located in the pre-pressing region;

when the rotary table is in a second operating position, the fourth carrier is located in the mounting-dismounting region, the first carrier is located in the TCP adhesive-attaching region, the second carrier is located in the PCB adhesive-attaching region, and the third carrier is located in the pre-pressing region;

when the rotary table is in a third operating position, the third carrier is located in the mounting-dismounting region, the fourth carrier is located in the TCP adhesive-attaching region, the first carrier is located in the PCB adhesive-attaching region, and the second carrier is located in the pre-pressing region;

when the rotary table is in a fourth operating position, the second carrier is located in the mounting-dismounting region, the third carrier is located in the TCP adhesive-attaching region, the fourth carrier is located in the PCB adhesive-attaching region, and the first carrier is located in the pre-pressing region;

a first driving device, which is mounted on the base and configured to drive the rotary table to rotate around the axis of the rotary table;

a TCP side adhesive-attaching mechanism, which is mounted on the base and is configured to attach a conductive film onto a chip-on-film on a carrier located in the TCP adhesive-attaching region;

a PCB side adhesive-attaching mechanism, which is mounted on the base and is configured to attach a conductive film onto a chip-on-film on a carrier located in the PCB adhesive-attaching region; and a pre-pressing mechanism, which is mounted on the base and is configured to pre-press conductive films attached on a chip-on-film on a carrier located in the pre-pressing region.

In the attaching apparatus for chip-on-films, the rotary table is in the first operating position, the second operating position, the third operating position and the fourth operating position successively during the rotation around its axis. When the rotary table is in any one of the above operating positions, there is one carrier in each of the mounting-dismounting region, the TCP adhesive-attaching region, the PCB adhesive-attaching region and the pre-pressing region of the base.

When the rotary table is in the first operating position, the first carrier is located in the mounting-dismounting region, the second carrier is located in the TCP adhesive-attaching region, the third carrier is located in the PCB adhesive-attaching region, and the fourth carrier is located in the pre-pressing region. In this case, an operator may detach a chip-on-film, on which adhesive-attaching is already performed, away from the first carrier and mount a chip-on-film, on which adhesive-attaching is not performed, onto the first carrier. The TCP side adhesive-attaching mechanism attaches an anisotropic conductive film onto a side of a chip-on-film on the second carrier in the TCP adhesive-attaching region, the side being configured to connect to a TCP. The PCB side adhesive-attaching mechanism attaches an anisotropic conductive film onto a side of a chip-on-film on the third carrier in the PCB adhesive-attaching region, the side being configured to connect to a PCB. The pre-pressing mechanism pre-presses anisotropic conductive films attached on a chip-on-film on the fourth carrier in the pre-pressing region.

Then, the rotary table rotates around its axis to the second operating position. At this time, the fourth carrier is located in the mounting-dismounting region, the first carrier is located in the TCP adhesive-attaching region, the second carrier is located in the PCB adhesive-attaching region, and the third carrier is located in the pre-pressing region. In this case, the operator may detach a chip-on-film, on which adhesive-attaching is already performed, away from the fourth carrier and mount a chip-on-film, on which adhesive-attaching is not performed, onto the fourth carrier. The TCP side adhesive-attaching mechanism attaches an anisotropic conductive film onto a side of a chip-on-film on the first carrier in the TCP adhesive-attaching region, the side being configured to connect to a TCP. The PCB side adhesive-attaching mechanism attaches an anisotropic conductive film onto a side of a chip-on-film on the second carrier in the PCB adhesive-attaching region, the side being configured to connect to a PCB. The pre-pressing mechanism pre-presses anisotropic conductive films attached on a chip-on-film on the third carrier in the pre-pressing region.

Then, the rotary table rotates around its axis to the third operating position. At this time, the third carrier is located in the mounting-dismounting region, the fourth carrier is located in the TCP adhesive-attaching region, the first carrier is located in the PCB adhesive-attaching region, and the second carrier is located in the pre-pressing region. In this case, the operator may detach a chip-on-film, on which adhesive-attaching is already performed, away from the third carrier and mount a chip-on-film, on which adhesive-attaching is not performed, onto the third carrier. The TCP side adhesive-attaching mechanism attaches an anisotropic conductive film onto a side of a chip-on-film on the fourth carrier in the TCP adhesive-attaching region, the side being configured to connect to a TCP. The PCB side adhesive-attaching mechanism attaches an anisotropic conductive film onto a side of a chip-on-film on the first carrier in the PCB adhesive-attaching region, the side being configured to connect to a PCB. The pre-pressing mechanism pre-presses anisotropic conductive films attached on a chip-on-film on the second carrier in the pre-pressing region.

Then, the rotary table rotates around its axis to the fourth operating position. At this time, the second carrier is located in the mounting-dismounting region, the third carrier is located in the TCP adhesive-attaching region, the fourth carrier is located in the PCB adhesive-attaching region, and the first carrier is located in the pre-pressing region. In this case, the operator may detach a chip-on-film, on which adhesive-attaching is already performed, away from the second carrier and mount a chip-on-film, on which adhesive-attaching is not performed, onto the second carrier. The TCP side adhesive-attaching mechanism attaches an anisotropic conductive film onto a side of a chip-on-film on the third carrier in the TCP adhesive-attaching region, the side being configured to connect to a TCP. The PCB side adhesive-attaching mechanism attaches an anisotropic conductive film onto a side of a chip-on-film on the fourth carrier in the PCB adhesive-attaching region, the side being configured to connect to a PCB. The pre-pressing mechanism pre-presses anisotropic conductive films attached on a chip-on-film on the first carrier in the pre-pressing region.

Then, the rotary table further rotates to the first operating position, and the above operations are repeated.

Hence, when using the above described attaching apparatus for chip-on-films, attaching operations are performed on multiple chip-on-films synchronously and continuously in a concurrent operating mode, thereby reducing wait time in continuous operations and improving production efficiency.

Optionally, the first driving device is a servo motor.

Optionally, the TCP side adhesive-attaching mechanism includes:

a vertical plate mounted on the base;

an adhesive tape roll installation shaft mounted on the vertical plate;

guiding shafts mounted on the vertical plate;

a conductive film claw-forcep, which is mounted on the vertical plate and configured to grab a conductive film when working;

a conductive film cutter, which is mounted on the vertical plate and configured to cut the conductive film when working;

a second driving device configured to drive the conductive film claw-forcep to work; and a third driving device configured to drive the conductive film cutter to work.

Optionally, the second driving device is a cylinder.

Optionally, the third driving device is a cylinder.

Optionally, the PCB side adhesive-attaching mechanism includes:

a vertical plate mounted on the base;

an adhesive tape roll installation shaft mounted on the vertical plate;

guiding shafts mounted on the vertical plate;

a conductive film claw-forcep, which is mounted on the vertical plate and configured to grab a conductive film when working;

a conductive film cutter, which is mounted on the vertical plate and configured to cut the conductive film when working;

a fourth driving device configured to drive the conductive film claw-forcep to work; and a fifth driving device configured to drive the conductive film cutter to work.

Optionally, the fourth driving device is a cylinder.

Optionally, the fifth driving device is a cylinder.

Optionally, the pre-pressing mechanism includes:

a vertical plate fixed on the base, where a bearing plate is provided on the vertical plate;

a pressing-head mechanism, which is slidably provided on the bearing plate and capable of pre-pressing a conductive film attached at a TCP side of a chip-on-film on a carrier in the pre-pressing region and a conductive film attached at a PCB side of the chip-on-film on the carrier in the pre-pressing region; and a sixth driving device which is configured to cooperate with the pressing-head mechanism to drive the pressing-head mechanism to work.

Optionally, the pressing-head mechanism is slidably arranged on the bearing plate, via a slide pathway and a slide groove slidably fitting with each other.

Optionally, the sixth driving device is a driving handle provided on the pressing-head mechanism.

Optionally, the sixth driving device is a cylinder.

Optionally, each carrier includes:

a seat fixed on the rotary table;

a first slider which is provided on the seat and is slidable along a first direction with respect to the seat;

a second slider which is provided on the first slider and is slidable along a second direction with respect to the first slider, the second direction being perpendicular to the first direction;

a first adjustment device for adjusting a relative position relationship between the first slider and the seat; and a second adjustment device for adjusting a relative position relationship between the second slider and the first slider.

Optionally, the first adjustment device includes a micrometer member; and/or the second adjustment device includes a micrometer member.

Optionally, each carrier includes:

a first seat;

a second seat fixed to the rotary table via the first seat; and a tray, which is configured to bear a chip-on-film and is slidably arranged on the second seat;

where a first position adjustment device which adjusts, along a first direction, a relative position relationship between the tray and the second seat, and a second position adjustment device which adjusts, along a second direction, the relative position relationship between the tray and the second seat are arranged on the second seat; and the first direction is perpendicular to the second direction.

DETAILED DESCRIPTION OF THE EMBODIMENTS

Technical solutions according to embodiments of the present disclosure are described clearly and completely hereinafter in conjunction with drawings used in the embodiments of the present disclosure. Apparently, the described embodiments are merely a part of rather than all of the embodiments of the present disclosure. Other embodiments obtained by the ordinary skilled in the art based on the embodiments of the present disclosure without paying creative efforts all fall within the scope of protection of the present disclosure.

Unless other definitions are given, technical terms or scientific terms used herein refer to normal meanings which can be understood by the ordinary skilled in the field to which the present disclosure relates. Terms such as "first" and "second" used in the specification and the list of claims of the present disclosure do not indicate any order, numbers or importance, and are merely used to distinguish different components. Similarly, terms such as "one" or "an" represent there exist at least one, rather than to limit the number. Terms such as "connected with" or "connected to" do not limit to physical or mechanical connections, and can include electrical connections which are either direct or indirect. Terms such as "above", "below", "left" and "right" are merely used to describe a relative position relationship; if the absolute position of one described object alters, the relative position relationship with respect to the described object alters correspondingly.

Figure 1:
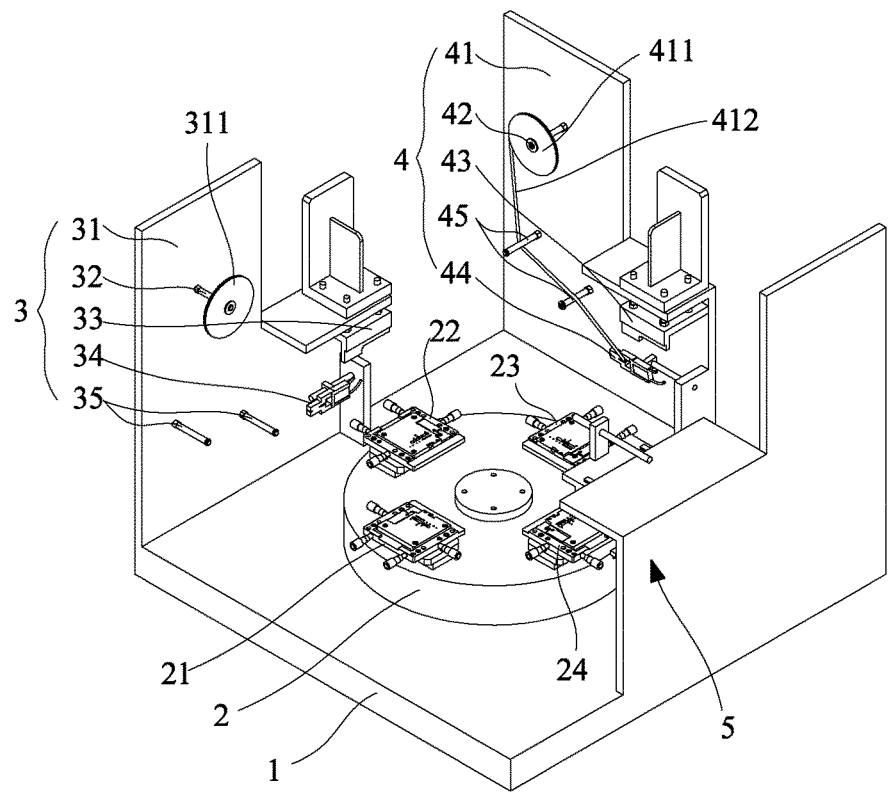
FIG. 1 is a schematic diagram showing an attaching apparatus for chip-on-films according to an embodiment of the present disclosure.

As shown in FIG. 1, an attaching apparatus for chip-on-films according to an embodiment of the present disclosure includes:

a base 1, where the base 1 is provided with a mounting-dismounting region, a TCP adhesive-attaching region, a PCB adhesive-attaching region, a pre-pressing region;

a rotary table 2, which is mounted on the base 1 and can rotate around an axis of the rotary table 2; where a first carrier 21, a second carrier 22, a third carrier 23 and a fourth carrier 24 are arranged on the rotary table 2; the rotary table 2 goes through a first operating position, a second operating position, a third operating position and a fourth operating position successively during a rotation around its axis; when the rotary table 2 is in the first operating position, the first carrier 21 is located in the mounting-dismounting region, the second carrier 22 is located in the TCP adhesive-attaching region, the third carrier 23 is located in the PCB adhesive-attaching region, and the fourth carrier 24 is located in the pre-pressing region; when the rotary table 2 is in the second operating position, the fourth carrier 24 is located in the mounting-dismounting region, the first carrier 21 is located in the TCP adhesive-attaching region, the second carrier 22 is located in the PCB adhesive-attaching region, and the third carrier 23 is located in the pre-pressing region; when the rotary table 2 is in the third operating position, the third carrier 23 is located in the mounting-dismounting region, the fourth carrier 24 is located in the TCP adhesive-attaching region, the first carrier 21 is located in the PCB adhesive-attaching region, and the second carrier 22 is located in the pre-pressing region; when the rotary table 2 is in the fourth operating position, the second carrier 22 is located in the mounting-dismounting region, the third carrier 23 is located in the TCP adhesive-attaching region, the fourth carrier 24 is located in the PCB adhesive-attaching region, and the first carrier 21 is located in the pre-pressing region;

a first driving device, which is mounted on the base 1 and is configured to drive the rotary table 2 to rotate around the axis of the rotary table 2;

a TCP side adhesive-attaching mechanism 3, which is mounted on the base 1 and is configured to attach a conductive film onto a chip-on-film on a carrier located in the TCP adhesive-attaching region;

a PCB side adhesive-attaching mechanism 4, which is mounted on the base 1 and is configured to attach a conductive film onto a chip-on-film on a carrier located in the PCB adhesive-attaching region; and a pre-pressing mechanism 5, which is mounted on the base 1 and is configured to pre-press conductive films attached on a chip-on-film on a carrier located in the pre-pressing region.

In the attaching apparatus for chip-on-films, the rotary table 2 is in the first operating position, the second operating position, the third operating position and the fourth operating position successively during the rotation around its axis. When the rotary table 2 is in any one of the operating positions, there is one carrier in each of the mounting-dismounting region, the TCP adhesive-attaching region, the PCB adhesive-attaching region and the pre-pressing region which are provided on the base 1.

When the rotary table 2 is in the first operating position, as shown in FIG. 1, the first carrier 21 is located in the mounting-dismounting region, the second carrier 22 is located in the TCP adhesive-attaching region, the third carrier 23 is located in the PCB adhesive-attaching region, and the fourth carrier 24 is located in the pre-pressing region. In this case, an operator may detach a chip-on-film, on which adhesive-attaching is already performed, away from the first carrier 21 and mount a chip-on-film, on which adhesive-attaching is not performed, onto the first carrier 21. The TCP side adhesive-attaching mechanism 3 attaches an anisotropic conductive film onto a side of a chip-on-film on the second carrier 22 in the TCP adhesive-attaching region, the side being configured to connect to a TCP. The PCB side adhesive-attaching mechanism 4 attaches an anisotropic conductive film onto a side of a chip-on-film on the third carrier 23 in the PCB adhesive-attaching region, the side being configured to connect to a PCB. The pre-pressing mechanism 5 pre-presses anisotropic conductive films attached on a chip-on-film on the fourth carrier 24 in the pre-pressing region.

Then, the rotary table 2 rotates clockwise around its axis by a set angle to the second operating position. At this moment, the fourth carrier 24 is located in the mounting-dismounting region, the first carrier 21 is located in the TCP adhesive-attaching region, the second carrier 22 is located in the PCB adhesive-attaching region, and the third carrier 23 is located in the pre-pressing region. In this case, the operator may detach a chip-on-film, on which adhesive-attaching is already performed, away from the fourth carrier 24 and mount a chip-on-film, on which adhesive-attaching is not performed, onto the fourth carrier 24. The TCP side adhesive-attaching mechanism 3 attaches an anisotropic conductive film onto a side of a chip-on-film on the first carrier 21 in the TCP adhesive-attaching region, the side being configured to connect to a TCP. The PCB side adhesive-attaching mechanism 4 attaches an anisotropic conductive film onto a side of a chip-on-film on the second carrier 22 in the PCB adhesive-attaching region, the side being configured to connect to a PCB. The pre-pressing mechanism 5 pre-presses anisotropic conductive films attached on a chip-on-film on the third carrier 23 in the pre-pressing region.

Then, the rotary table 2 rotates clockwise around its axis by a set angle to the third operating position. At this moment, the third carrier 23 is located in the mounting-dismounting region, the fourth carrier 24 is located in the TCP adhesive-attaching region, the first carrier 21 is located in the PCB adhesive-attaching region, and the second carrier 22 is located in the pre-pressing region. In this case, the operator may detach a chip-on-film, on which adhesive-attaching is already performed, away from the third carrier 23 and mount a chip-on-film, on which adhesive-attaching is not performed, onto the third carrier 23. The TCP side adhesive-attaching mechanism 3 attaches an anisotropic conductive film onto a side of a chip-on-film on the fourth carrier 24 in the TCP adhesive-attaching region, the side being configured to connect to a TCP. The PCB side adhesive-attaching mechanism 4 attaches an anisotropic conductive film onto a side of a chip-on-film on the first carrier 21 in the PCB adhesive-attaching region, the side being configured to connect to a PCB. The pre-pressing mechanism 5 pre-presses anisotropic conductive films attached on a chip-on-film on the second carrier 22 in the pre-pressing region.

Then, the rotary table 2 rotates clockwise around its axis by a set angle to the fourth operating position. At this moment, the second carrier 22 is located in the mounting-dismounting region, the third carrier 23 is located in the TCP adhesive-attaching region, the fourth carrier 24 is located in the PCB adhesive-attaching region, and the first carrier 21 is located in the pre-pressing region. In this case, the operator may detach a chip-on-film, on which adhesive-attaching is already performed, away from the second carrier 22 and mount a chip-on-film, on which adhesive-attaching is not performed, onto the second carrier 22. The TCP side adhesive-attaching mechanism 3 attaches an anisotropic conductive film onto a side of a chip-on-film on the third carrier 23 in the TCP adhesive-attaching region, the side being configured to connect to a TCP. The PCB side adhesive-attaching mechanism 4 attaches an anisotropic conductive film onto a side of a chip-on-film on the fourth carrier 24 in the PCB adhesive-attaching region, the side being configured to connect to a PCB. The pre-pressing mechanism 5 pre-presses anisotropic conductive films attached on a chip-on-film on the first carrier 21 in the pre-pressing region.

Then the rotary table 2 further rotates clockwise to the first operating position, and the above operations are repeated.

Hence, when using the above described attaching apparatus for chip-on-films, attaching operations are performed on multiple chip-on-films synchronously and continuously in a concurrent operating mode, thereby reducing waiting time in continuous operations and improving production efficiency.

Specifically, the first driving device, that drives the rotary table 2 to rotate around the axis of the rotary table 2 with respect to the base 1, is a servo motor. The servo motor can accurately control an angle by which the rotary table 2 rotates.

In a specific implementation, as shown in FIG. 1, the TCP side adhesive-attaching mechanism 3 includes:
a vertical plate 31 mounted on the base 1;
an adhesive tape roll installation shaft 32 mounted on the vertical plate 31, where an adhesive tape roll 311 is installed on the adhesive tape roll installation shaft 32;
guiding shafts 35 mounted on the vertical plate 31;
an anisotropic conductive film claw-forcep 34, which is mounted on the vertical plate 31 and configured to grab an anisotropic conductive film when working;
an anisotropic conductive film cutter 33, which is mounted on the vertical plate 31 and configured to cut the anisotropic conductive film when working;
a second driving device configured to drive the anisotropic conductive film claw-forcep 34 to work; and
a third driving device configured to drive the anisotropic conductive film cutter 33 to work.

In the attaching apparatus for chip-on-films with the above described structure, the anisotropic conductive film is extracted from the adhesive tape roll 311, guided by the guiding shafts 35, and grabbed and transferred by the anisotropic conductive film claw-forcep 34. The anisotropic conductive film is of good stability and is not prone to fall off. Then, the anisotropic conductive film is cut into an appropriate size by the anisotropic conductive film cutter 33 and attached, by the anisotropic conductive film claw-forcep 34, onto the side of the chip-on-film for connecting to the TCP.

Specifically, the second driving device for driving the anisotropic conductive film claw-forcep 34 to work may be a cylinder.

Apparently, the third driving device for driving the anisotropic conductive film cutter 33 to work may also be a cylinder.

According to an implementation, as shown in FIG. 1, the PCB side adhesive-attaching mechanism 4 includes:
a vertical plate 41 mounted on the base 1;
an adhesive tape roll installation shaft 42 mounted on the vertical plate 41, where an adhesive tape roll 411 wrapped with an anisotropic conductive film 412 is installed on the adhesive tape roll installation shaft 42;
guiding shafts 45 mounted on the vertical plate 41;
an anisotropic conductive film claw-forcep 44, which is mounted on the vertical plate 41 and configured to grab the anisotropic conductive film when working;
an anisotropic conductive film cutter 43, which is mounted on the vertical plate 41 and configured to cut the anisotropic conductive film when working;
a fourth driving device configured to drive the anisotropic conductive film claw-forcep 44 to work; and
a fifth driving device configured to drive the anisotropic conductive film cutter 43 to work.

In the attaching apparatus for chip-on-films with the above described structure, the anisotropic conductive film 412 is extracted from the adhesive tape roll 411, guided by the guiding shafts 45, and grabbed and transferred by the anisotropic conductive film claw-forcep 44. The anisotropic conductive film is of good stability and is not prone to fall off. Then, the anisotropic conductive film 412 is cut into an appropriate size by the anisotropic conductive film cutter 43 and attached, by the anisotropic conductive film claw-forcep 44, onto the side of the chip-on-film for connecting to the PCB.

Specifically, the fourth driving device for driving the anisotropic conductive film claw-forcep 44 to work may be a cylinder.

Similarly, the fifth driving device for driving the anisotropic conductive film cutter 43 to work may also be a cylinder.

Figure 2:
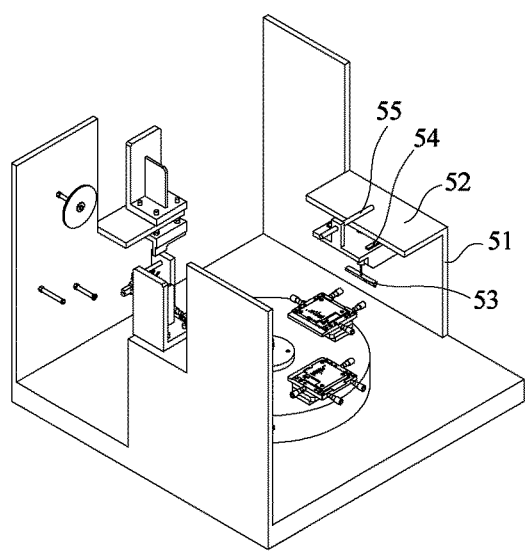
FIG. 2 is a schematic diagram showing a pre-pressing mechanism of the attaching apparatus for chip-on-films according to an embodiment of the present disclosure.

According to an implementation, as shown in FIG. 2, the pre-pressing mechanism 5 of the attaching apparatus for chip-on-films includes:

a vertical plate 51 fixed on the base 1, where a bearing plate 52 is provided on the vertical plate 51;

a pressing-head mechanism 53, which is slidably provided on the bearing plate 52 and can pre-press the anisotropic conductive film attached at a TCP side of the chip-on-film on a carrier in the pre-pressing region and the anisotropic conductive film attached at a PCB side of the chip-on-film on the carrier in the pre-pressing region; and a sixth driving device configured to cooperate with the pressing-head mechanism 53 to drive the pressing-head mechanism to work.

Specifically, the pressing-head mechanism 53 may be slidably arranged on the bearing plate 52, via a slide pathway 54 and a slide groove slidably fitting with each other.

More specifically, the sixth driving device for driving the pressing-head mechanism 53 to work may be a driving handle 55 provided on the pressing-head mechanism 53.

Alternatively, the sixth driving device may be a cylinder.

Figure 3:
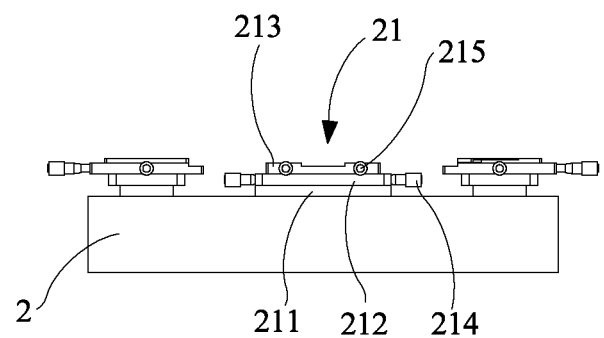
FIG. 3 is a schematic diagram showing a rotary table and carriers in the attaching apparatus for chip-on-films according to an embodiment of the present disclosure.

According to a preferred implementation, as shown in FIG. 2, the first carrier 21, the second carrier 22, the third carrier 23 and the fourth carrier 24 arranged on the rotary table 2 have a same structure. Taking the first carrier 21 shown in FIG. 3 as an example, the first carrier 21 includes:

a seat 211 fixed on the rotary table 2;

a first slider 212 which is provided on the seat 211 and may slide along a first direction with respect to the seat 211;

a second slider 213 which is provided on the first slider 212 and may slide along a second direction with respect to the first slider 212, the second direction being perpendicular to the first direction;

a first adjustment device 214 for adjusting a relative position relationship between the first slider 212 and the seat 211; and a second adjustment device 215 for adjusting a relative position relationship between the second slider 213 and the first slider 212.

In the attaching apparatus for chip-on-films, the chip-on-film on the first carrier 21 can be aligned by adjusting positions of the first slier 212 and the second slider 213.

According to a preferred implementation, for enhancing accuracy of the first adjustment device 214 in adjusting the position of the first slider 212, the first adjustment device 214 may include a micrometer member.

Similarly, for enhancing accuracy of the second adjustment device 215 in adjusting the position of the second slider 213, the second adjustment device 215 includes a micrometer member.

Figure 4:
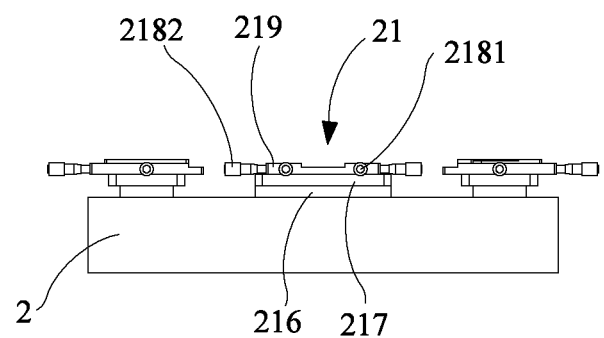
FIG. 4 is another schematic diagram showing a rotary table and carriers in the attaching apparatus for chip-on-films according to an embodiment of the present disclosure.

According to another implementation, as shown in FIG. 4, the first carrier 21 includes a seat 216, a seat 217 and a tray 219 for bearing and mounting the chip-on-film. The seat 217 is fixed to the rotary table 2 via the seat 216. The tray 219 is slidably arranged on the seat 217. A position adjustment device 2181 which adjusts, along a first direction, a relative position relationship between the tray 219 and the seat 217, and an adjustment device 2182 which adjusts, along a second direction, a relative position relationship between the tray 219 and the seat 217 are arranged on the seat 217. The first direction is perpendicular to the second direction. The first carrier 21 may adjust the position of the tray 219 through the adjustment device 2181 and the adjustment device 2182, thereby further adjusting the position of the chip-on-film placed on the tray 219.

Obviously, the ordinary skilled in the art can make various modifications to and variants of the present disclosure without departing from the mind and scope of the present disclosure. The present disclosure intends to include all these modifications and variants if they fall within the scope of the claims of the present disclosure or equivalent technologies.

What is claimed is:

1. An attaching apparatus for chip-on-films, comprising:
a base, which is provided with a mounting-dismounting region, a transmission control protocol module (TCP) adhesive-attaching region, a print circuit board (PCB) adhesive-attaching region and a pre-pressing region;
a rotary table, which is mounted on the base and rotatable around an axis of the rotary table; wherein
a first carrier, a second carrier, a third carrier and a fourth carrier are arranged on the rotary table;
when the rotary table is in a first operating position, the first carrier is located in the mounting-dismounting region, the second carrier is located in the TCP adhesive-attaching region, the third carrier is located in the PCB adhesive-attaching region, and the fourth carrier is located in the pre-pressing region;
when the rotary table is in a second operating position, the fourth carrier is located in the mounting-dismounting region, the first carrier is located in the TCP adhesive-attaching region, the second carrier is located in the PCB adhesive-attaching region, and the third carrier is located in the pre-pressing region;
when the rotary table is in a third operating position, the third carrier is located in the mounting-dismounting region, the fourth carrier is located in the TCP adhesive-attaching region, the first carrier is located in the PCB adhesive-attaching region, and the second carrier is located in the pre-pressing region;
when the rotary table is in a fourth operating position, the second carrier is located in the mounting-dismounting region, the third carrier is located in the TCP adhesive-attaching region, the fourth carrier is located in the PCB adhesive-attaching region, and the first carrier is located in the pre-pressing region;
a first driving device, which is mounted on the base and configured to drive the rotary table to rotate around the axis of the rotary table;
a TCP side adhesive-attaching mechanism, which is mounted on the base and is configured to attach a conductive film onto a chip-on-film on a carrier located in the TCP adhesive-attaching region;
a PCB side adhesive-attaching mechanism, which is mounted on the base and is configured to attach a conductive film onto a chip-on-film on a carrier located in the PCB adhesive-attaching region; and
a pre-pressing mechanism, which is mounted on the base and is configured to pre-press conductive films attached on a chip-on-film on a carrier located in the pre-pressing region.

2. The attaching apparatus for chip-on-films according to claim 1, wherein the first driving device is a servo motor.

3. The attaching apparatus for chip-on-films according to claim 1, wherein the TCP side adhesive-attaching mechanism comprises:
- a vertical plate mounted on the base;
- an adhesive tape roll installation shaft mounted on the vertical plate;
- guiding shafts mounted on the vertical plate;
- a conductive film claw-forcep, which is mounted on the vertical plate and configured to grab a conductive film when working;
- a conductive film cutter, which is mounted on the vertical plate and configured to cut the conductive film when working;
- a second driving device configured to drive the conductive film claw-forcep to work; and
- a third driving device configured to drive the conductive film cutter to work.

4. The attaching apparatus for chip-on-films according to claim 3, wherein the second driving device is a cylinder.

5. The attaching apparatus for chip-on-films according to claim 3, wherein the third driving device is a cylinder.

6. The attaching apparatus for chip-on-films according to claim 3, wherein each carrier comprises:
- a seat fixed on the rotary table;
- a first slider which is provided on the seat and is slidable along a first direction with respect to the seat;
- a second slider which is provided on the first slider and is slidable along a second direction with respect to the first slider, the second direction being perpendicular to the first direction;
- a first adjustment device for adjusting a relative position relationship between the first slider and the seat; and
- a second adjustment device for adjusting a relative position relationship between the second slider and the first slider.

7. The attaching apparatus for chip-on-films according to claim 3, wherein each carrier comprises:
- a first seat;
- a second seat fixed to the rotary table via the first seat; and
- a tray, which is configured to bear a chip-on-film and is slidably arranged on the second seat;
- wherein a first position adjustment device which adjusts, along a first direction, a relative position relationship between the tray and the second seat, and a second position adjustment device which adjusts, along a second direction, the relative position relationship between the tray and the second seat are arranged on the second seat; and the first direction is perpendicular to the second direction.

8. The attaching apparatus for chip-on-films according to claim 1, wherein the PCB side adhesive-attaching mechanism comprises:
- a vertical plate mounted on the base;
- an adhesive tape roll installation shaft mounted on the vertical plate;
- guiding shafts mounted on the vertical plate;
- a conductive film claw-forcep, which is mounted on the vertical plate and configured to grab a conductive film when working;
- a conductive film cutter, which is mounted on the vertical plate and configured to cut the conductive film when working;
- a fourth driving device configured to drive the conductive film claw-forcep to work; and
- a fifth driving device configured to drive the conductive film cutter to work.

9. The attaching apparatus for chip-on-films according to claim 8, wherein the fourth driving device is a cylinder.

10. The attaching apparatus for chip-on-films according to claim 8, wherein the fifth driving device is a cylinder.

11. The attaching apparatus for chip-on-films according to claim 8, wherein each carrier comprises:
- a seat fixed on the rotary table;
- a first slider which is provided on the seat and is slidable along a first direction with respect to the seat;
- a second slider which is provided on the first slider and is slidable along a second direction with respect to the first slider, the second direction being perpendicular to the first direction;
- a first adjustment device for adjusting a relative position relationship between the first slider and the seat; and
- a second adjustment device for adjusting a relative position relationship between the second slider and the first slider.

12. The attaching apparatus for chip-on-films according to claim 8, wherein each carrier comprises:
- a first seat;
- a second seat fixed to the rotary table via the first seat; and
- a tray, which is configured to bear a chip-on-film and is slidably arranged on the second seat;
- wherein a first position adjustment device which adjusts, along a first direction, a relative position relationship between the tray and the second seat, and a second position adjustment device which adjusts, along a second direction, the relative position relationship between the tray and the second seat are arranged on the second seat; and the first direction is perpendicular to the second direction.

13. The attaching apparatus for chip-on-films according to claim 1, wherein the pre-pressing mechanism comprises:
- a vertical plate fixed on the base, wherein a bearing plate is provided on the vertical plate;
- a pressing-head mechanism, which is slidably provided on the bearing plate and capable of pre-pressing a conductive film attached at a TCP side of a chip-on-film on a carrier in the pre-pressing region and a conductive film attached at a PCB side of the chip-on-film on the carrier in the pre-pressing region; and
- a sixth driving device which is configured to cooperate with the pressing-head mechanism to drive the pressing-head mechanism to work.

14. The attaching apparatus for chip-on-films according to claim 13, wherein the pressing-head mechanism is slidably arranged on the bearing plate, via a slide pathway and a slide groove slidably fitting with each other.

15. The attaching apparatus for chip-on-films according to claim 13, wherein the sixth driving device is a driving handle provided on the pressing-head mechanism.

16. The attaching apparatus for chip-on-films according to claim 13, wherein the sixth driving device is a cylinder.

17. The attaching apparatus for chip-on-films according to claim 13, wherein each carrier comprises:
- a seat fixed on the rotary table;
- a first slider which is provided on the seat and is slidable along a first direction with respect to the seat;
- a second slider which is provided on the first slider and is slidable along a second direction with respect to the first slider, the second direction being perpendicular to the first direction;
- a first adjustment device for adjusting a relative position relationship between the first slider and the seat; and a second adjustment device for adjusting a relative position relationship between the second slider and the first slider.

18. The attaching apparatus for chip-on-films according to claim 1, wherein each carrier comprises:
a seat fixed on the rotary table;
a first slider which is provided on the seat and is slidable along a first direction with respect to the seat;
a second slider which is provided on the first slider and is slidable along a second direction with respect to the first slider, the second direction being perpendicular to the first direction;
a first adjustment device for adjusting a relative position relationship between the first slider and the seat; and
a second adjustment device for adjusting a relative position relationship between the second slider and the first slider.

19. The attaching apparatus for chip-on-films according to claim 18, wherein the first adjustment device comprises a micrometer member; and/or
the second adjustment device comprises a micrometer member.

20. The attaching apparatus for chip-on-films according to claim 1, wherein each carrier comprises:
a first seat;
a second seat fixed to the rotary table via the first seat; and
a tray, which is configured to bear a chip-on-film and is slidably arranged on the second seat;
wherein a first position adjustment device which adjusts, along a first direction, a relative position relationship between the tray and the second seat, and a second position adjustment device which adjusts, along a second direction, the relative position relationship between the tray and the second seat are arranged on the second seat; and the first direction is perpendicular to the second direction.

* * * * *